United States Patent [19]

Dlugokecki

[11] Patent Number: 5,700,697
[45] Date of Patent: *Dec. 23, 1997

[54] METHOD FOR PACKAGING AN INTEGRATED CIRCUIT USING A RECONSTRUCTED PACKAGE

[75] Inventor: Joseph J. Dlugokecki, Poway, Calif.

[73] Assignee: Silicon Packaging Technology, San Diego, Calif.

[*] Notice: The term of this patent shall not extend beyond the expiration date of Pat. No. 5,318,926.

[21] Appl. No.: 471,739

[22] Filed: Jun. 6, 1995

Related U.S. Application Data

[60] Continuation-in-part of Ser. No. 212,507, Mar. 10, 1994, abandoned, which is a division of Ser. No. 11,957, Feb. 1, 1993, Pat. No. 5,318,926.

[51] Int. Cl.$^6$ .......................... H01L 21/58; H01L 21/28; H01L 21/48; H01L 21/56
[52] U.S. Cl. .......................... 437/8; 437/210; 437/217; 437/220; 437/923; 437/974
[58] Field of Search .................. 437/217, 220, 437/923, 974, 210, 8

[56] References Cited

U.S. PATENT DOCUMENTS

| | | | |
|---|---|---|---|
| H1379 | 12/1994 | Meuer ............................ | 451/38 |
| 3,482,419 | 12/1969 | Rogers et al. .................. | 65/36 |
| 3,627,901 | 12/1971 | Happ ............................... | 437/217 |
| 3,762,039 | 10/1973 | Douglass et al. .............. | 29/588 |
| 3,969,813 | 7/1976 | Minetti et al. ................. | 29/427 |
| 4,089,704 | 5/1978 | Heiss, Jr. et al. .............. | 134/29 |
| 4,359,360 | 11/1982 | Harris et al. ................... | 156/345 |
| 4,384,917 | 5/1983 | Wensink ......................... | 156/627 |
| 4,474,621 | 10/1984 | Saccocio et al. ............... | 134/1 |
| 4,567,006 | 1/1986 | Covington et al. ............. | 264/22 |

(List continued on next page.)

FOREIGN PATENT DOCUMENTS

| | | | |
|---|---|---|---|
| 223295 | 6/1986 | German Dem. Rep. ........ | 437/923 |
| 60-124834 | 3/1985 | Japan . | |
| 60-124834 | 7/1985 | Japan ............................ | 437/923 |
| 61-72196 | 3/1986 | Japan . | |
| 61-110437 | 5/1986 | Japan . | |
| 61-24405 | 10/1986 | Japan ............................ | 437/210 |
| 62-247553 | 10/1987 | Japan . | |
| 63-184347 | 7/1988 | Japan . | |
| 63-287043 | 11/1988 | Japan . | |
| 2-260548 | 10/1990 | Japan ............................ | 437/923 |
| 2278740 | 11/1990 | Japan . | |
| 496259 | 3/1992 | Japan . | |
| 9220096 | 11/1992 | WIPO . | |

OTHER PUBLICATIONS

"Repair Technology for Modules", W. K. Spielmann et al., IBM Technical Disclosure Bulletin vol. 10, No. 11, p. 1810, Apr. 1968.

Novus Technologies, Inc. Promotional Literature; (no date available) 1423 San Rafael Ave. NE, P.O. Box 53416, Aluquerque, NM 87153.

ICOM Corporation Promotional Literature; (no date available) 734 Silver Spur Rd., Ste. 201, Rolling Hills Estates, CA 90274.

*Primary Examiner*—David Graybill
*Attorney, Agent, or Firm*—Fitch, Even, Tabin & Flannery

[57] ABSTRACT

A reconstructed package for an integrated circuit (IC) chip and a method of re-configuring any prefabricated IC package (with or without a silicon chip and wires inside) so that an IC chip can be installed and interconnected for normal use. A pre-molded plastic or other package is abraded to expose the wire bond pads and to form a mounting surface to which a new chip may be mounted. The encapsulating material is removed without damaging the plating material on the lead frame. The new chip is then mounted onto the mounting surface and new wire bonds are connected between the new chip and the lead frame. Encapsulating material, such as epoxy, is then placed over the chip and wire bonds and cured. The invention provides an alternative process whereby the die can be encapsulated in minutes per unit.

20 Claims, 3 Drawing Sheets

U.S. PATENT DOCUMENTS

| | | | |
|---|---|---|---|
| 4,691,225 | 9/1987 | Murakami et al. | 357/80 |
| 4,768,286 | 9/1988 | Ketcham | 29/841 |
| 4,914,813 | 4/1990 | Layher et al. | 29/843 |
| 4,980,019 | 12/1990 | Baerg et al. | 156/643 |
| 5,041,396 | 8/1991 | Valero | 437/923 |
| 5,138,430 | 8/1992 | Gow et al. | 357/70 |
| 5,149,662 | 9/1992 | Eichelberger | 437/209 |
| 5,155,068 | 10/1992 | Tada | 437/974 |
| 5,180,093 | 1/1993 | Stansbury et al. | 228/1.1 |
| 5,252,179 | 10/1993 | Ellerson et al. | 156/655 |
| 5,398,926 | 3/1995 | Dlugokecki | 437/974 |
| 5,406,117 | 4/1995 | Dlugokecki et al. | 257/659 |
| 5,424,254 | 6/1995 | Damiot | 437/243 |

METHOD FOR PACKAGING AN INTEGRATED CIRCUIT USING A RECONSTRUCTED PACKAGE

This application is a continuation-in-part of application Ser. No. 08/212,507, filed Mar. 10, 1994, abandoned; which is a divisional of application Ser. No. 08/011,957, filed Feb. 1, 1993, now U.S. Pat. No. 5,318,926.

BACKGROUND OF THE INVENTION

The present invention relates, in general, to encapsulated plastic packages for integrated circuit (silicon) chips and, more specifically, to a prefabricated encapsulated package for integrated circuit chips wherein some the encapsulation material of the package is removed, e.g., by forming a cavity or other surface in the package, that exposes the lead frame, and which is thereafter reconstructed with the desired integrated circuit.

The process of designing and producing a new integrated circuit device (silicon chip) is very time consuming and requires the efforts of very talented and educated individuals. When a new integrated circuit is designed, the first article produced must be tested as soon as possible to verify that the device is performing in accordance with the design requirements.

The standard, most used process to package an integrated circuit die has been the plastic package, constructed primarily of a metal lead frame and a polymeric insulating material. Because the process of encapsulating die in molded plastic packages can be easily automated, plastic packages are relatively inexpensive compared to ceramic or hybrid hermetic packages and consequently have become the mainstay of the electronics industry.

With a few modifications, the basic assembly process for plastic encapsulation can be used to construct a variety of package types. For example, FIG. 1 illustrates a pin-in-hole package: a dual-in-line package (DIP). FIGS. 2–3 illustrate two surface mount packages: a plastic leaded chip carrier (PLCC) and a quad flatpack (QFP), respectively. Each of these plastic packages are constructed from the same basic assembly techniques, which techniques are well known in the art.

Approximately 80% of the integrated circuits that are sold and produced today are packaged or encapsulated in epoxy using the technique described above. The majority of the integrated circuit packaging industry now resides in countries outside of the United States. Heretofore, there has been relatively little investment in the United States in developing the required hardware tooling and equipment required to accomplish this process, which is very expensive. Thus, most of the tooling and equipment necessary for this process is also manufactured outside the United States. This means that, in most cases, if a company who designs integrated circuits requires integrated circuit dies packaged in epoxy encapsulation, they must pay the price for the offshore service and wait the time it takes for delivery. For companies eager to produce and evaluate new prototype devices, this can translate into costly delays.

Another popular method of packaging the integrated circuit die is to use a package constructed from ceramic. However, ceramic packaging is relatively expensive and is used primarily for high performance, military applications.

If the design is such that performance of the device can be characterized in a substitute package such as a ceramic package, then this provides an alternative method for quick turnaround, providing, of course, that the package is available. However, in many cases, a ceramic package is a poor substitute for simulating the performance of the desired encapsulated device, which is the intended production configuration. That is, in some designs, the function of the integrated circuit die is affected by the presence of the encapsulating material on its surface and the dimensions of the package conductor paths (leads). Thus, it becomes necessary to reevaluate and validate the design in the final production package configuration. Another disadvantage of the use of ceramic packages for prototype units is that it necessitates a modification of test sockets and printed circuit boards to receive the prototype ceramic packages in order to test and validate the new design.

SUMMARY OF THE INVENTION

The expense of configuring the prototype package into a substitute ceramic package and the expense of using offshore encapsulated prototype packages can be eliminated using the present invention. Advantageously, the present invention allows the installation of a new integrated circuit chip (die) in a reconstructed encapsulated package which is mechanically identical to, or at least compatible with, the production part.

The present invention is directed towards a reconstructed plastic or other package, and a method of re-configuring any pre-fabricated integrated circuit package (with or without an existing silicon chip and wires inside) so that an integrated circuit die can be installed and interconnected for normal use.

The present invention, advantageously, takes a pre-fabricated plastic or other integrated circuit (IC) package and selectively removes, using one of several methods of abrasion, the encapsulation material from which the IC package is made to expose the wire bond pads of the lead frame. (The wire bond pads comprise that portion of the lead frame where the chip makes electrical contact with the lead frame, typically through the use of small wires that are bonded between the wire bond pads and corresponding contact pads around the periphery of the die.) Such encapsulation removal typically includes the forming of a mounting surface, e.g., a flat surface, over the chip mounting area (which chip mounting area on the lead frame is typically referred to as the "die attach pad"). A new chip is then mounted onto the formed mounting surface. Electrical connection is made between the contact pads of the new chip and the exposed wire bond pads of the lead frame. The IC package is then reconstructed, e.g., by applying a polymeric insulating material, or by otherwise encapsulating the new chip in a suitable polymeric or other insulating material, in order to impart to the IC package its desired form.

A key feature of the reconstructed package of the present invention is that the wire bond pads are exposed without damaging the plating material on the lead frame. This is a very critical parameter since, without this step, it would be extremely difficult to establish a reliable electrical connection with the wire bond pads of the lead frame. The net result is a plastic or other package that looks and performs identically to the same device that has been transfer molded using the more costly and time-consuming method of the prior art.

Using the present invention, and in particular when removing the encapsulation material to expose the wire bond pads, it is immaterial what happens to the old die, if any, that may be present in the IC package. All that is important is that the wire bond pads be exposed without damaging the plating material thereon, and that a suitable mounting surface be formed on which the new die can be mounted. Thus, the old die, if any, may be removed, may be partially ground away, or may itself serve as a platform on which the new die is mounted.

The present invention further contemplates a method of packaging an integrated circuit chip by modifying a pre-fabricated plastic or other package, removing existing encapsulating material to expose the wire bond pads of the lead frame, and in so doing forming a mounting surface over or near the die attach pad and wire bond pads, and then reconstructing the package by mounting a new chip to the mounting surface, electrically connecting the new chip to the exposed wire bond pads, and adding insulating material to encapsulate the new chip and reform the desired IC package profile.

The formation of the mounting surface for the new die, which may comprise a cavity formed within the encapsulation material, typically includes the steps of gross removal of the encapsulating material (which may include total or partial removal of an existing chip and wires), using a dentist drill or other mechanical grinding or abrasive removal technique to remove the encapsulation material to within about 2-5 mils of the wire bond pads, precision removal of the remaining encapsulating material using a sand blaster; and then cleaning the device using liquid impingement, plasma etching or ultrasonic techniques. Advantageously, the precision material removal step does not damage the silver or gold plating from the wire bond pads. Further, the invention contemplates that the method of encapsulation removal, for some applications, may be practiced in a single step, e.g., sand blasting or liquid impingement using a suitable paste or liquid as the blasting/impinging agent, in order to expose the wire bond pads.

In an alternative method, the prefabricated plastic package obtained could have a cavity pre-molded therein so that the material removal and cleaning steps would not be necessary. The remaining steps of die attachment, wire bonding, and encapsulation would then be performed, as described above.

The invention thus provides a process alternative whereby the die can be encapsulated at a very low per unit cost and in only minutes per unit without the need to go offshore to have dies encapsulated using more traditional and expensive techniques.

BRIEF DESCRIPTION OF THE DRAWINGS

Further features and advantages of the present invention may be more readily understood with reference to the following description taken in conjunction with the accompanying drawings, in which.

DETAILED DESCRIPTION OF THE INVENTION

The following description is of the best mode presently contemplated for practicing the invention. This description is not to be taken in a limiting sense but is made merely for the purpose of describing the general principles of the invention. The scope of the invention should be ascertained with reference to the issued claims. In the description of the invention that follows, like numerals or reference designators will be used to refer to like parts or elements throughout.

In the description that follows, reference is made to the use of a "plastic" package. It is to be understood, however, that the use of a plastic package is only exemplary, not limiting. The invention may be practiced with any type of package where techniques are available for removal of the encapsulating material to expose the wire bond pads regardless of the type of encapsulation material from which the IC package is made.

First, a plastic or other IC package is fabricated or procured using the techniques that are well known in the art, with or without installation of an integrated circuit chip (die). In other words, an IC package is produced which looks exactly like, or is at least compatible with, the desired IC package but may not necessarily contain an integrated circuit die. These devices (also known as "dummy" packages) are being produced and sold routinely and quite inexpensively. They are purchased primarily for the purpose of adjusting (setting up) automatic handling equipment for electrical testers and printed circuit board soldering equipment.

The encapsulation process for fabricating the "dummy" plastic packages is known as transfer molding. For a complete description on transfer molding, and the fabrication of plastic packages in general, see for example, *Packaging—Electronic Materials Handbook*, 1989, Vol. 1, pp. 470–480, published by ASM International, which reference is hereby incorporated herein by reference.

Figure 1:
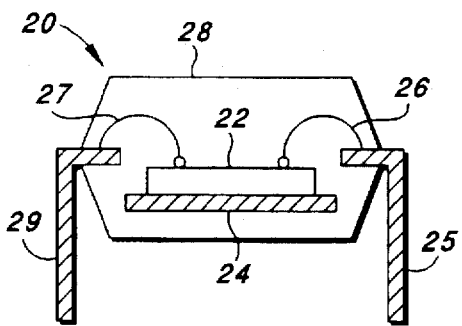
FIG. 1 shows an cross-sectional view of a plastic dual-in-line package (DIP), as is known in the prior art.

Briefly, and with reference to the prior art IC package shown in FIG. 1, the fabrication of a plastic package 20 (as is known in the prior art) begins with a metal lead frame 25 that is either stamped or chemically etched. The choice of lead frame material depends on die attach methods, reliability, thermal requirements, and mounting requirements (through-hole or surface mount). The lead frame 25 may be comprised of copper, "KOYAR", nickel, alloy 42, or aluminum, with the two most commonly used materials being metal alloy 42 and copper. However, wire bonds do not readily adhere to these bare materials. Thus, to provide a consistent and reliable wire bond attachment, one very critical step in preparing the lead frame prior to attachment of the die is to plate the wire bonding surfaces (i.e., the tips of the fingers nearest the die, also referred to hereinafter as "wire bond pads") with silver or gold. The leads extending from the resultant package can then be soldered directly to a printed circuit board.

Once a die 22 has been cut or diced from a wafer (not shown), the die 22 is attached to the center pad 24 of the lead frame 25, hereinafter referred to as the die attach pad 24.

Attachment can be made by using a gold-silicon eutectic or a polymer adhesive, such as epoxy or polyamide. Following die attachment, each of a plurality of contact pads (not shown) on the die 22 are interconnected to a respective one of a plurality of wire bond pads 27 on the lead frame 25 by wire bonds 26. The wire bonding process can be accomplished in a variety of ways, for example, by ultrasonic vibration pressure, by thermocompression bonding, or by a combination of both methods (called thermosonic bonding).

After the wires bonds 26 have been attached, the die 22 and wire bonds 26 are encapsulated in a plastic or polymeric material defined by the outline 28. The encapsulating material serves as a dielectric insulator and shields against environmental degradation. The encapsulation process, known in the art as transfer molding, is the method used to mold thermosetting polymers (i.e., polymers that are fluid at low temperatures but which react irreversibly when heated to form a highly crosslinked network which is no longer capable of being melted). The result is encapsulation of the integrated circuit die 22 and the wire bonds 26 within the encapsulating material 28, with the legs 29 of the lead frame 25 extending from the body of the package. This encapsulation process provides an electrical connection from the contact pads on the die to the outside world and provides excellent protection to the silicon chip and the wires.

The encapsulating materials used, as indicated above, are thermosetting polymers. The encapsulating material ideally has the following properties: high purity (particularly with respect to ionic contaminants); excellent adhesion to other packaging materials (such as Si, passivation, lead frame, etc.); poor adhesion to mold surfaces; impermeability to moisture and low moisture absorption; sufficient rigidity to protect the die; low coefficient of thermal expansion (CTE); low elastic modulus; heat resistance sufficient to withstand soldering operations; ease of processing; and low cost.

While no polymer material satisfies all of these requirements, formulations of epoxy resins, hardeners, and inorganic fillers have been developed and are in widespread use. Epoxies are useful as encapsulant materials due to a combination of factors including low cure shrinkage, fast cure speed, a polar nature, and the ability to be blended with a wide variety of modifiers to impart the desired mechanical properties. Epoxy monomers and prepolymers are commercially available in a wide variety of viscosities, and thus are easily tailored to meet a particular molding requirement. Other thermosetting polymers, such as silicones and unsaturated polyesters, are also employed to a lesser degree. The primary use of silicone polymers is in high-temperature applications (in the range of 200° C.) that warrant the extra cost. Advantages of unsaturated resins include extremely fast cure kinetics, the cure reaction does not generate any by-products, and low cost, however, they also have inferior strength and environmental resistance compared to epoxies and silicones.

In the embodiment described below, the encapsulating material is epoxy and epoxy-based resins (hereinafter referred to simply as "epoxy"). However, it is understood that any of the plastic or polymeric insulating materials described above, or any plastic or polymeric material yet to be invented which have similar properties, or any other suitable encapsulating material, could be utilized with the present inventive method and are within the scope of the present invention.

Figure 2:
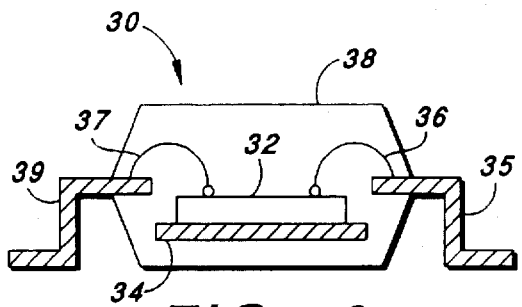
FIG. 2 shows an cross-sectional view of a plastic quad flatpack (QFP), as is known in the prior art.
Figure 3:
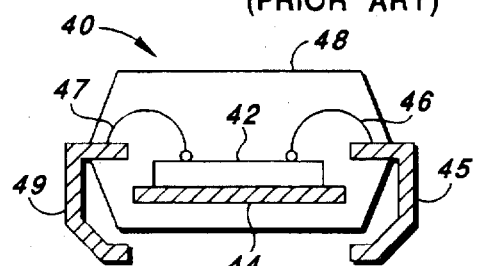
FIG. 3 shows an cross-sectional view of a plastic leaded chip carrier (LCC), as is known in the prior art.

FIGS. 1-3 show, respectively, a dual-in-line package (DIP) 20, a quad flatpack (QFP) 30, and a plastic leaded chip carrier (PLCC) 40, which are known in the prior art. FIGS. 1-3 illustrate but three examples of plastic packages, among the many plastic packages known in the art, which may be modified by the method of the present invention. Other plastic packages that may be modified using the present inventive method include, but are not limited to, single-in-line packages (SIPs), zigzag-in-line packages (ZIPs), quad-in-line packages (QUIPs), small outline (SO) packages, fine-pitch quad flatpacks (FQFPs), pin grid arrays (PGAs), etc. For a complete description of the various plastic package families and their characteristics, see for example, *Electronic Packaging and Interconnection Handbook*, Charles A. Harper, 1991, pp. 6.41–6.49, which reference is incorporated herein by reference. It is understood that the packages shown in FIGS. 1-3 are presented for illustration purposes only, and that the present invention can be extended to all pre-fabricated plastic packages.

The packages shown in FIGS. 1-3 are included to illustrate the similarities in construction in plastic packages. Each package (20, 30 and 40) has, respectively, a die (22, 32 and 42) mounted onto a die attach pad (24, 34 and 44), a lead frame (25, 35 and 45), and a set of wire bonds (26, 36 and 46). Each lead frame contains a plurality of leads or fingers (not shown) for interconnection to a plurality of contact pads (also not shown) on each die via the respective set of wire bonds. Each package (20, 30 and 40) includes encapsulation material (defined by outline 28, 38 and 48, respectively). Each lead further has a plurality of wire bond pads (27, 37, 47) and legs (29, 39, 49) which extend from the encapsulated portion (28, 38, 48) of the package, respectively.

Figure 4:
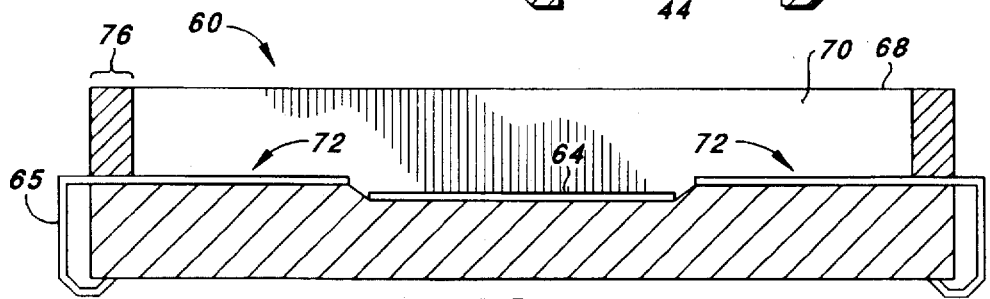
FIG. 4 shows a cross-sectional view of one embodiment using a pre-fabricated, plastic leaded chip (LCC) carrier modified in accordance with the present inventive method and illustrating the area which is abraded and removed, thus exposing the lead frame.
Figure 5:
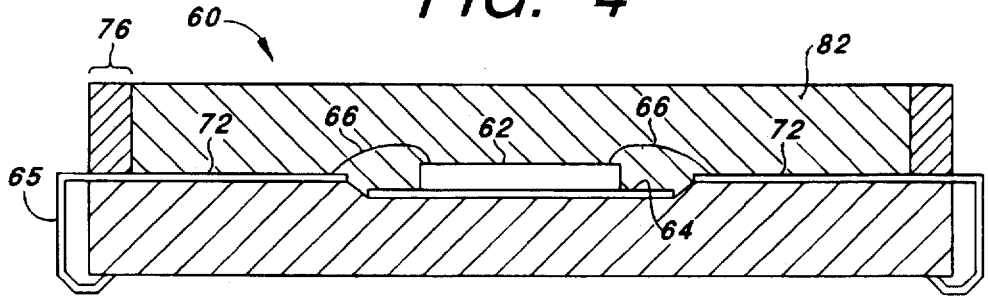
FIG. 5 shows a cross-sectional view of the embodiment shown in FIG. 4 using a pre-fabricated, plastic leaded chip carrier (LCC) re-constructed in accordance with the teachings of the present invention.
Figure 6:
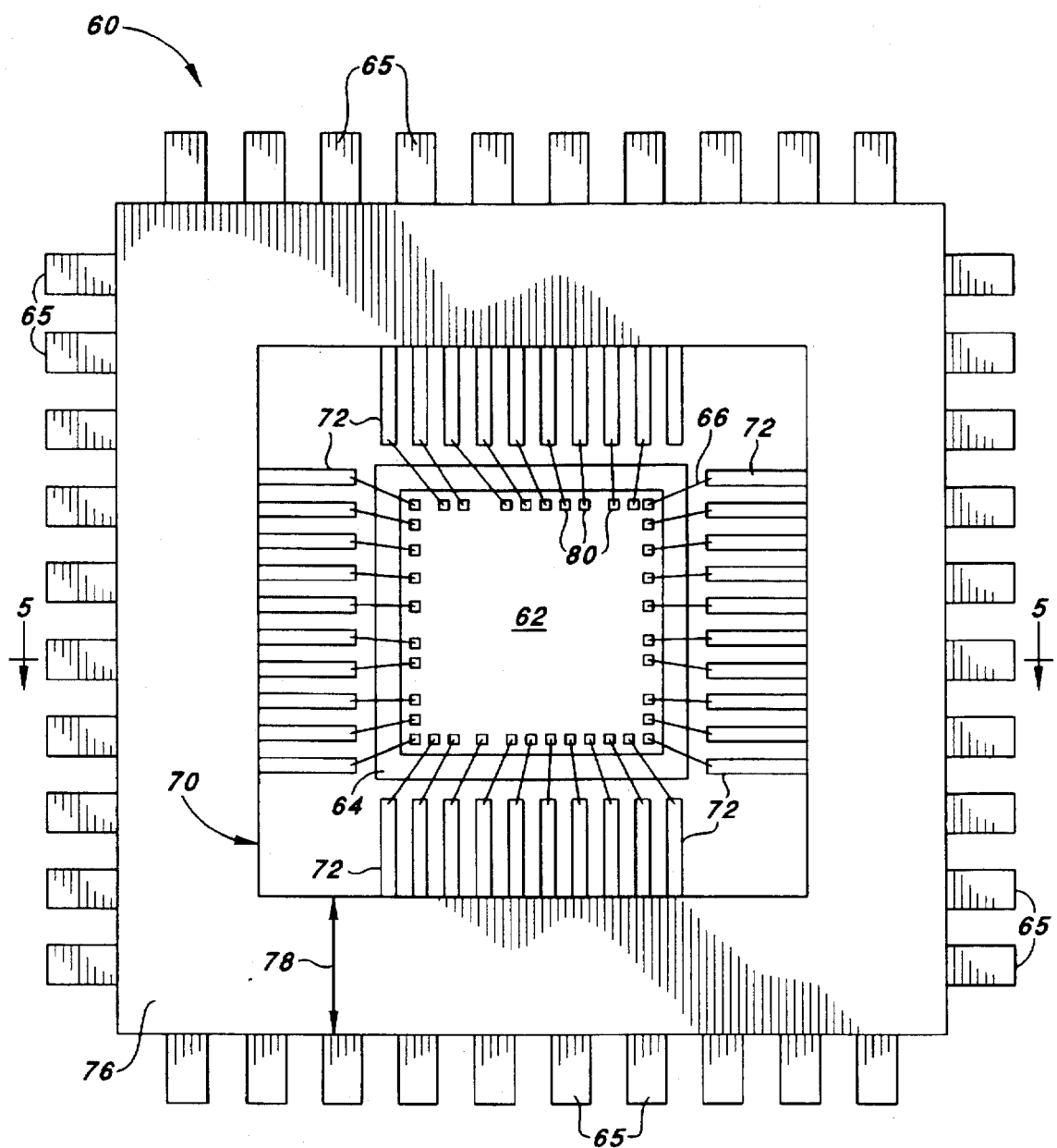
FIG. 6 shows a plan view of an integrated circuit chip (die) mounted onto the die attach pad of the plastic leaded chip carrier shown in FIGS. 4 and 5.

FIGS. 4-6 illustrate a pre-fabricated plastic leadless chip carrier (LCC) modified using the method of the present invention. While the following will be directed toward a reconstructed plastic leadless chip carrier, it is understood that any of the plastic packages known in the art may be modified and reconstructed using the present inventive method and are within the scope of the present invention.

FIGS. 4 and 5 show a cross-sectional view of a pre-fabricated plastic leadless chip carrier (LCC) 60 before and after a die is attached, respectively, taken across the lines 5—5 shown in FIG. 6. FIG. 6 shows a plan view of the leadless chip carrier shown in FIG. 5.

As seen in FIG. 4, a plastic leadless chip carrier 60 is shown having a die attach pad 64 and a lead frame 65. The original outer dimension of the package is indicted by outline 68. A cavity 70 is formed over the die attach pad 64 and a portion of the lead frame 72 (i.e., wire bond pads 72). The removal of the epoxy material will be described in more detail below in the description of the present inventive method.

As shown in FIGS. 5 and 6, a die 62 is mounted onto the die attach pad 64 and a plurality of wire bonds 66 are used to connect the plurality of input/output pads 80 on chip 62 to a respective one of the wire bond pads 72 on the lead frame 65. The cavity 70 (FIG. 4) is then filled with epoxy 82. A wall 76 is left on all four sides of the package 60 (best seen in FIG. 6) to support the epoxy 82 during the curing process. The width 78 of the wall 76 must be at least wide enough to expose the wire bond pads 72 on the lead frame 65, and can be sufficiently narrow enough so long as it provides enough support to hold the epoxy 82 during the curing process.

Figure 7:
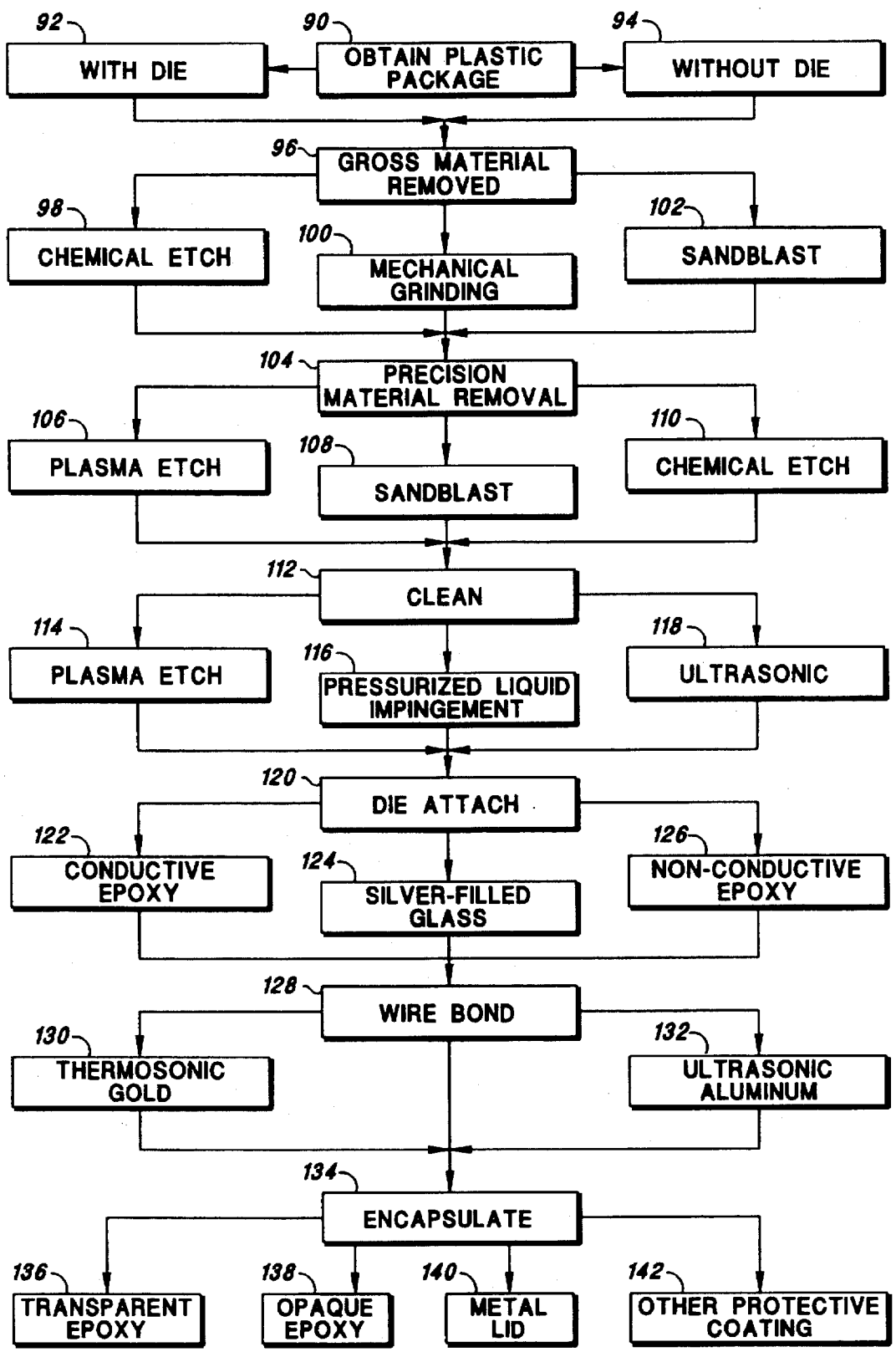
FIG. 7 describes the process steps necessary to reconstruct the pre-fabricated, plastic package of the present invention.

The process of removing epoxy to create the cavity 70 is described more completely with reference to the process diagram shown in FIG. 7. It is to be emphasized that the process depicted in FIG. 7 is not intended to be limiting in the sense that all of the steps must be carried out in the sequence shown. For example, the process shown in FIG. 7 refers to gross material removal (Block 96) followed by precision material removal (Block 104). In fact, the gross/precision material removal may be carried out in a single step using any of the techniques, or equivalent techniques, described for the gross or precision material removal.

With reference to FIG. 7, Block 90 comprises the step of obtaining (either by fabricating or by procuring) a desired plastic package, hereinafter referred to as "dummy" device. As indicated in Blocks 92 and 94, it does not matter if the plastic or other package contains a dummy die inside since the removal process will also remove, or disable, any existing die and wire bonds.

In Block 96, referenced as the step of gross removal of epoxy from the surface of the dummy device, the original condition of the silver or gold plating must be sufficiently preserved to allow attachment of a die and wire bonds using standard techniques. This is typically accomplished by clearing away the majority of the solid epoxy using a mechanical grinding technique, or equivalent abrasive removal technique, such as with a dentist's drill, down to within 2 to 5 mils of the surface of the wire bond pads of the lead frame. Such mechanical grinding technique may also remove the existing die, either completely or partially. Alternatively, the gross material removal step may simply remove the encapsulation material over and around the periphery of the existing die, and then the existing die may be popped out or pried off of its die attach pad using conventional mechanical/thermal techniques. Ideally, the epoxy is removed only in the center region 70 of the package leaving vertical walls 76 around the perimeter of the package 60 to retain the liquid epoxy 82 which will fill the space after installation of the new die 62. However, it is possible to reconstruct the package without such vertical walls, when necessary.

Currently known process options, as defined by this invention, for removal of the surface epoxy, i.e., the encapsulant material, may include chemical etching (Block 98), mechanical grinding (Block 100), and sand blasting (Block 102). In one embodiment, a mechanical grinding technique is used, i.e., a diamond impregnated dental burr is used. The hand piece of the drill is rigidly held by an arm that allows the hand piece to move only in the vertical direction. The vertical position is precisely controlled with a micrometer. The dental burr is lowered and cuts into the encapsulant. The burr is lowered to within 2–5 mils if the surface of the lead frame. At this point, the dummy package is moved on the horizontal plane and the side of the diamond impregnated dental burr pulverizes the solid epoxy and/or the die. The area of removal of the epoxy is controlled by viewing the process under a microscope while moving the package (which is rigidly held in a chuck) on the horizontal plane. This process can easily be automated by employing servo motors controlled by digital logic circuits. In another embodiment, a sand blasting technique may be used, i.e., liquid and/or paste impingement under high pressure, as described below for precision removal and/or cleaning techniques.

Block 104 comprises the steps of precision material removal. This can be achieved using plasma etching (Block 106), sand blasting (Block 108) or chemical etching (Block 110). In one embodiment, the final several mils of material are removed using a precision, hand held sand blaster under a magnifying glass. A very fine sodium bicarbonate is used as the sand blast media. Alternatively, a liquid or liquid paste may be used as the sand blast media. This sand blasting process will remove the epoxy at a much faster rate than it will the silver, therefore the epoxy can be removed without causing significant damage to the silver.

Next is the cleaning step (Block 112) in preparation of the removal of the residual sandblast material. Cleaning can be achieved using either a plasma etch (Block 114), a pressurized liquid impingement (Block 116), or ultrasonic cleaning (Block 118). In the preferred embodiment, cleaning is accomplished using deionized water which is delivered to the surface of the sand blasted areas using a high pressure pulsating liquid ejector device such as that used for cleaning between teeth (a water pick). To remove the water, the water pick washing step is repeated using electronic grade alcohol. Alternatively, ultrasonic cleaning in deionized water and alcohol and/or plasma etching may be used in place of the high pressure liquid impingement cleaning step.

Block 120 indicates the die attach step. The new die 62 is then installed using thermally cured conductive epoxy (Block 122), silver filled glass (Block 124), or non-conductive epoxy (Block 126), as desired by the application.

The next step (Block 128) is to interconnect between the input/output contact pads 80 on the die 62 to the wire bond pads 72 on the lead frame 65. This is accomplished using one of the known wire bonding methods, preferably ultrasonic aluminum (Block 130) or thermosonic gold wire (Block 132) bonding techniques. During the encapsulating step (Block 134), the cavity 70 is then filled with epoxy and cured, typically at 150°–200° C. for 2–4 hours. As indicated in Blocks 136 and 138, the epoxy may be transparent or opaque, respectively. Alternatively, a metal lid (Block 140) or any other protective cover or coatings (Block 142), such as for alpha particle protection or a moisture barrier, could be substituted for, or used in addition to, the epoxy fill.

In an alternative method, the plastic package obtained in step 90 could have the cavity pre-molded therein so that the material removal and cleaning steps (92, 96, 100, 104 and 112) would be unnecessary. The remaining steps of die attachment 120, wire bonding 128, and encapsulation 134 would then be performed, as described above.

Figure 8:
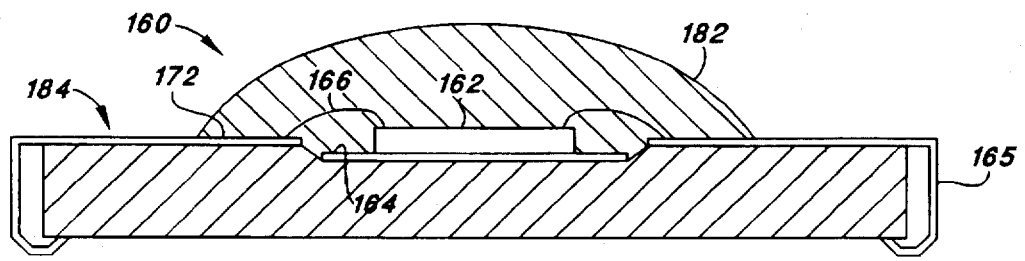
FIG. 8 describes another embodiment of the present invention.

In yet another embodiment, shown in FIG. 8, the plastic package 160 does not include the vertical walls 76 (shown in FIG. 4). For example, in very small packages (approx. 150 mils wide), there may not be enough room to include vertical walls with a sufficient thickness to hold the epoxy. For these smaller packages, the encapsulation material can be removed over the entire top surface 184 of the package 160. The liquid epoxy 182 may then be placed over, or "blobbed", on top of the mounted chip 162, the die attach pad 164, the wire bonds 166 and the wire bond pads 172. The epoxy 182 can be easily formulated to have a viscosity such that the chip 162 and wire bonds 166 are sufficiently protected. Since the epoxy is non-conductive, even if the epoxy ran over the edges of the package, the device would still be functional. While the package may not be precisely the same outline as a custom built device, the objectives of the packaging technique are still met. Further, after the "blob" on top and around the edges of the IC package has cured, it can be trimmed or cut using conventional techniques to give the package a form factor shape that at least approximates the original IC package form shape.

The end product is an electrically functioning device with external dimensions duplicating (or at least compatible with) the original dummy device and the transfer molded device produced using the prior art.

In this highly competitive semiconductor industry, it is always economically advantageous to decrease the amount of time it takes to get a new product to market. The present invention advantageously dramatically reduces the time to get the product to market by allowing the assembly and testing of the first article units in less time as compared to currently used methods. Even if ceramic packages are available that are acceptable for prototype use, plastic packages produced using the inventive method can, in most cases, be provided at a much lower cost.

Thus, the invention advantageously utilizes rejected electrical test devices which normally are discarded as the basic starting element to mount a new integrated circuit die. While the above description has been described to provide a fast turn-around for prototypes, it should be apparent to one skilled in the art that the present invention may provide an inexpensive method of packaging a die for production use as well. This may be of particular value to customers with low volume and do not want to incur the tooling costs for an off-shore or equivalent conventional program.

Although an exemplary embodiment of the present invention has been shown and described, it will be apparent to those having ordinary skill in the art that a number of changes, modifications, or alterations to the invention as described herein may be made, none of which depart from the spirit of the present invention. All such changes, modifications, and alterations should therefore be seen as within the scope of the present invention.

What is claimed is:

1. A method of packaging an integrated circuit chip, comprising the steps of:
   (a) obtaining a circuit package, the package having a lead frame encapsulated in an encapsulating material, the lead frame having a plurality of fingers, each finger having a wire bond pad thereon;
   (b) removing the encapsulating material to expose a plurality of the wire bond pads;
   (c) mounting a chip within the package, the chip having a plurality of contact pads thereon;
   (e) connecting a wire bond between one of the plurality of contact pads on the chip and one of the plurality of wire bond pads; and
   (f) encapsulating the chip and the plurality of wire bond pads in an insulating material.

2. The method of claim 1 wherein the step of removing the encapsulating material comprises removing the encapsulating material within a first distance above the surface of the wire bond pads.

3. The method of claim 1 wherein the step of removing the encapsulating material comprises grinding the encapsulating material.

4. The method of claim 1 wherein the step of removing the encapsulating material comprises chemically etching the encapsulating material.

5. The method of claim 1 wherein the step of removing the encapsulating material comprises sand blasting the encapsulating material.

6. The method of claim 5 wherein the step of sand blasting the encapsulating material comprises impinging a fine powder against the encapsulating material under high pressure.

7. The method of claim 5 wherein the step of sand blasting the encapsulating material comprises impinging a liquid against the encapsulating material under high pressure.

8. The method of claim 7 wherein the step of impinging a liquid comprises delivering a pulsating liquid under high pressure against the encapsulating material.

9. The method of claim 1 wherein the step of removing the encapsulating material comprises plasma etching the encapsulating material.

10. The method of claim 1 wherein the step of removing the encapsulating material comprises impinging the encapsulating material with a pressurized liquid.

11. The method of claim 1 wherein the step of removing the encapsulating material includes removing at least a portion of another chip mounted within the package.

12. The method of claim 1 further comprising cleaning the exposed wire bond pads prior to connecting the plurality of wire bonds between the contact pads on the chip and the wire bond pads.

13. The method of claim 12 wherein the step of cleaning the wire bond pads comprises delivering de-ionized water using a high pressure pulsating liquid ejector device.

14. The method of claim 13 wherein the step of cleaning the wire bond pads further comprises removing the de-ionized water by delivering electronic grade alcohol using a high pressure pulsating liquid ejector device.

15. The method of claim 1 further comprising cleaning ultrasonically the exposed wire bond pads in de-ionized water.

16. The method of claim 1 further comprising cleaning ultrasonically the exposed wire bond pads in alcohol.

17. A method of packaging an integrated circuit chip in an existing pre-fabricated package, the package having a lead frame encapsulated in an insulating material, the lead frame having a plurality of fingers, each finger having a wire bond pad thereon, the method comprising the steps of:
   (a) exposing a plurality of the wire bond pads by removing the insulating material thereover;
   (b) mounting the integrated circuit chip within the package, the integrated circuit chip having a plurality of contact pads thereon;
   (d) electrically connecting a plurality of the contact pads on the integrated circuit chip to a plurality of the exposed wire bond pads; and
   (e) encapsulating the integrated circuit chip and exposed wire bond pads with an encapsulating material.

18. The method of packaging an integrated circuit chip as set forth in claim 17 wherein the step of exposing a plurality of the wire bond pads comprises using at least one removal technique selected from the group comprising: sand blasting, mechanical grinding, chemical etching, plasma etching, ultrasonic cleaning, and pressurized liquid impingement.

19. A method of packaging an integrated circuit chip by modifying a circuit package having encapsulated wire bond pads to which electrical connection is to be made by an encapsulated integrated circuit chip, the method comprising: removing the existing encapsulating material to expose the wire bond pads, mounting the integrated circuit chip within the package and electrically connecting it to the wire bond pads, and reconstructing the package by adding insulating material over the mounted integrated circuit chip and the wire bond pads.

20. The method of packaging an integrated circuit chip as set forth in claim 19 wherein the step of removing the existing encapsulating material comprises using at least one removal technique selected from the group comprising: sand blasting, grinding, chemical etching, plasma etching, ultrasonic cleaning, and pressurized liquid impingement.

* * * * *